United States Patent
Sakaguchi et al.

(10) Patent No.: US 10,634,999 B2
(45) Date of Patent: Apr. 28, 2020

(54) RESIN COMPOSITION FOR FORMING COLOR FILTER UNDERLAYER FILM

(71) Applicant: NISSAN CHEMICAL INDUSTRIES, LTD., Tokyo (JP)

(72) Inventors: Takahiro Sakaguchi, Funabashi (JP); Isao Adachi, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 159 days.

(21) Appl. No.: 15/328,650

(22) PCT Filed: Jun. 25, 2015

(86) PCT No.: PCT/JP2015/068388
§ 371 (c)(1),
(2) Date: Jan. 24, 2017

(87) PCT Pub. No.: WO2016/013344
PCT Pub. Date: Jan. 28, 2016

(65) Prior Publication Data
US 2017/0227848 A1     Aug. 10, 2017

(30) Foreign Application Priority Data

Jul. 24, 2014  (JP) ................ 2014-150974

(51) Int. Cl.
| | | |
|---|---|---|
| *G03F 7/11* | (2006.01) | |
| *G03F 7/09* | (2006.01) | |
| *C08F 212/14* | (2006.01) | |
| *C08F 220/14* | (2006.01) | |
| *C08F 220/28* | (2006.01) | |
| *C08F 220/32* | (2006.01) | |
| *C09D 125/18* | (2006.01) | |
| *C09D 133/08* | (2006.01) | |
| *C09D 133/14* | (2006.01) | |
| *G02B 5/22* | (2006.01) | |
| *G03F 7/00* | (2006.01) | |
| *G03F 7/16* | (2006.01) | |
| *G03F 7/20* | (2006.01) | |
| *G03F 7/26* | (2006.01) | |
| *G03F 7/40* | (2006.01) | |

(52) U.S. Cl.
CPC ............ *G03F 7/11* (2013.01); *C08F 212/145* (2013.01); *C08F 220/14* (2013.01); *C08F 220/28* (2013.01); *C08F 220/32* (2013.01); *C09D 125/18* (2013.01); *C09D 133/08* (2013.01); *C09D 133/14* (2013.01); *G02B 5/223* (2013.01); *G03F 7/0007* (2013.01); *G03F 7/094* (2013.01); *G03F 7/16* (2013.01); *G03F 7/168* (2013.01); *G03F 7/20* (2013.01); *G03F 7/26* (2013.01); *G03F 7/40* (2013.01); *C08F 2220/281* (2013.01); *C08F 2220/325* (2013.01)

(58) Field of Classification Search
CPC .............. G02B 5/223; G02F 1/133514; G02F 1/133516; G03F 7/11; G03F 7/094; G03F 7/0007
USPC ............................................................ 430/7
See application file for complete search history.

(56) References Cited

U.S. PATENT DOCUMENTS 6,323,287 B1 * 11/2001 Foster .................. B41C 1/1008
525/328.8
8,257,910 B1 * 9/2012 Guerrero ................ G03F 7/091
430/322
(Continued)

FOREIGN PATENT DOCUMENTS

| JP | H07-181473 A | 7/1995 |
|---|---|---|
| JP | H07-294723 A | 11/1995 |

(Continued)

OTHER PUBLICATIONS

Computer-generated translation of WO 2008/029706 (Sep. 2006). (Year: 2006).*

(Continued)

*Primary Examiner* — John A McPherson
(74) *Attorney, Agent, or Firm* — Oliff PLC

(57) ABSTRACT

There is provided a resin composition for forming a color filter underlayer film that can form a cured film having excellent solvent resistance, heat resistance, and transparency and can reduce generation of the color resist residue at the time of formation of a color filter on the cured film. The resin composition for forming a color filter underlayer film comprising: a homopolymer or a copolymer having a structure unit of Formula (1); an acid compound; a solvent; and a crosslinking agent in an amount of 0% by mass to 35% by mass based on a content of a solid content of the resin composition:

Formula (1)

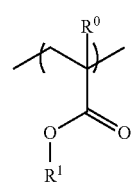

(1)

(where $R^0$ is a hydrogen atom or methyl group; $R^1$ is a $C_{1-6}$ hydrocarbon group having at least one hydroxy group as a substituent; and the $C_{1-6}$ hydrocarbon group further optionally has an ether bond).

3 Claims, 6 Drawing Sheets

(56) References Cited

U.S. PATENT DOCUMENTS

2003/0146416 A1* 8/2003 Takei ............... C08L 25/18
                                                    252/500
2016/0009946 A1* 1/2016 Kitagawa .......... G03F 7/0002
                                                    264/447

FOREIGN PATENT DOCUMENTS

| JP | H08-271715 | A | | 10/1996 |
|----|------------|---|---|---------|
| JP | 2000-344866 | A | | 12/2000 |
| JP | 2005-241728 | A | | 9/2005 |
| JP | 2006-096983 | A | * | 4/2006 |
| JP | 2007-200905 | A | | 8/2007 |
| JP | 2008-031370 | A | | 2/2008 |
| JP | 4222457 | B2 | | 2/2009 |
| JP | 2010-256868 | A | | 11/2010 |
| JP | 2014-080589 | A | | 5/2014 |
| TW | I294990 | B | | 3/2008 |
| TW | 200833765 | A | | 8/2008 |
| TW | 201437767 | A | | 10/2014 |
| WO | WO 2008/029706 | A1 | * | 9/2006 |
| WO | 2013-005619 | A1 | | 1/2013 |

OTHER PUBLICATIONS

Computer-generated translation of JP 2006-096983 (Apr. 2006). (Year: 2006).*
Sep. 8, 2015 Written Opinion issued in International Patent Application No. PCT/JP2015/068388.
Sep. 8, 2015 International Search Report issued in International Patent Application No. PCT/JP2015/068388.
Dec. 27, 2018 Office Action Issued in Taiwanese Patent Application No. 104122155.
Jan. 30, 2019 Office Action Issued in Japanese Patent Application No. 2016-535851.

* cited by examiner

RESIN COMPOSITION FOR FORMING COLOR FILTER UNDERLAYER FILM

TECHNICAL FIELD

The present invention relates to a resin composition for forming a color filter underlayer film. More specifically, the present invention relates to a resin composition used for forming a cured film and a planarization film that form a base of a color filter in a device including the color filter such as an image sensor and a display device.

BACKGROUND ART

In recent years, color filters have been one of the essential components for devices such as CCD image sensors, CMOS image sensors, liquid crystal displays, and organic EL displays.

Generally, in order to protect a color filter and to planarize the surface unevenness of the color filter, a transparent resin film such as a protection film and a planarization film is formed as the upper layer of the color filter. In order to improve adhesion between the color filter and a base substrate and to planarize the unevenness due to existence of, for example, a circuit wiring part, a light-shielding film, and an inner lens, a transparent resin film is also formed as the under layer of the color filter. A composition for forming such transparent resin films is described in, for example, Patent Document 1 to Patent Document 4.

For forming the color filter, for example, color resists of three colors of red, green and blue that contain pigments or dyes are generally used. A method for forming the color filter containing the color resists of three colors includes applying a color resist of a first color, exposing the applied color resist to light, and developing and heating the exposed color resist to form a color resist pattern of the first color. Thereafter, the method includes forming the color resist patterns of a second color and a third color in a similar manner to the resist pattern of the first color to form a color filter.

In such a method for forming a color filter, it is important to reduce generation of a color resist residue at the time of the color resist pattern formation in order to reduce deterioration in color reproducibility of the color filter and decrease in the yield of devices including the color filter.

When the color filter is formed on the transparent resin film, properties of reducing generation of the color resist residue as described above are required to the transparent resin film. When the color resist pattern is formed on a conventional transparent resin film, however, the properties of reducing generation of the color resist residue are not sufficiently satisfied.

PRIOR ART DOCUMENTS

Patent Documents

Patent Document 1: Japanese Patent Application Publication No. 2000-344866 (JP 2000-344866 A)
Patent Document 2: Japanese Patent Application Publication No. 2008-031370 (JP 2008-031370 A)
Patent Document 3: Japanese Patent No. 4222457
Patent Document 4: International Publication WO 2013/005619 Pamphlet

SUMMARY OF THE INVENTION

Problem to be Solved by the Invention

The present invention has been made in view of the above problems, and an object of the present invention is to provide a resin composition for forming a color filter underlayer film that can form a cured film having excellent solvent resistance, heat resistance, and transparency and can reduce generation of the color resist residue at the time of formation of a color filter on the cured film. Another object of the present invention is to provide a color filter underlayer film and a planarization film having excellent solvent resistance, heat resistance, and transparency.

Means for Solving the Problem

As a result of intensive studies for solving the above problems, the present inventors have accomplished the present invention. The present invention includes a resin composition for forming a color filter underlayer film comprising: a homopolymer or a copolymer having a structure unit of Formula (1); an acid compound; a solvent; and a crosslinking agent in an amount of 0% by mass to 35% by mass based on a content of a solid content of the resin composition:

Formula (1)

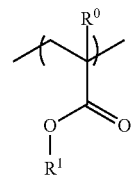

(1)

(where $R^0$ is a hydrogen atom or methyl group; $R^1$ is a $C_{1-6}$ hydrocarbon group having at least one hydroxy group as a substituent; and the $C_{1-6}$ hydrocarbon group further optionally has an ether bond).

The copolymer may further comprise a structure unit other than the structure unit of Formula (1).

The present invention also comprises a color filter underlayer film or a planarization film prepared from the resin composition for forming a color filter underlayer film.

The present invention also comprises a method for forming a color filter comprising the steps of: applying the resin composition for forming a color filter underlayer film on a substrate and heating the applied resin composition to form a color filter underlayer film; applying a color resist on the color filter underlayer film and heating the applied color resist to form a color resist film; and exposing the color resist film to light, developing the exposed color resist film, and rinsing the developed color resist film to form a color resist pattern.

Effects of the Invention

The color filter underlayer film or the planarization film formed from the resin composition for forming a color filter underlayer film of the present invention has excellent chemical resistance, heat resistance, and transparency. Due to these excellent properties, the color filter underlayer film or the planarization film formed from the resin composition for forming a color filter underlayer film of the present invention can significantly reduce possibility of deterioration and damage in devices during the process of exposing the films to chemical liquids such as solvents, or acid or alkali solutions or processing of exposing the films to high temperature such as sputtering, dry etching, and solder reflow in forming processes of the films or forming processes of wiring and peripheral devices. When the color filter underlayer film or the planarization film is formed from the resin composition for forming a color filter underlayer film of the present invention and a color resist is applied on the color filter underlayer film or the planarization film, the problem of intermixing with the color resist, the problem of generation of the color resist residue, and the problem of deformation and delamination of the color filter underlayer film or the planarized film caused by the chemical liquids can also be significantly reduced. Consequently, the resin composition for forming a color filter underlayer film of the present invention is suitable for a material forming the color filter underlayer film and the planarization film.

MODES FOR CARRYING OUT THE INVENTION

The present invention includes a resin composition for forming a color filter underlayer film including a specific homopolymer or copolymer, an acid compound, and a solvent. Hereinafter, each component will be described in detail. The solid content obtained by removing the solvent from the resin composition for forming a color filter underlayer film of the present invention is usually 0.01% by mass to 50% by mass.

<Polymer>

The homopolymer or the copolymer contained in the resin composition for forming a color filter underlayer film of the present invention is a polymer having a structure unit of Formula (1). Here, the copolymer means a polymer obtained by polymerizing two or more kinds of monomers. In Formula (1), examples of the $C_{1-6}$ hydrocarbon group having at least one hydroxy group as the substituent that $R^1$ represents include hydroxymethyl group, hydroxyethyl group, hydroxypropyl group, hydroxybutyl group, dihydroxypropyl group, and dihydroxybutyl group. When the $C_{1-6}$ hydrocarbon group further includes an ether bond, examples of the group include —$C_2H_4OC_2H_4OH$ group, —$C_2H_4OC_2H_4OC_2H_4OH$ group, and —$C_3H_6OC_3H_6OH$ group.

Examples of the compound (monomer) forming the structure unit of Formula (1) include hydroxymethyl (meth)acrylate, 2-hydroxyethyl (meth)acrylate, 2-hydroxypropyl (meth)acrylate, 3-hydroxypropyl (meth)acrylate, 2,3-dihydroxypropyl (meth)acrylate, 2-hydroxybutyl (meth)acrylate, 4-hydroxybutyl (meth) acrylate, 3,4-dihydroxybutyl (meth) acrylate, diethylene glycol mono(meth)acrylate, and dipropylene glycol mono(meth)acrylate. These compounds may be used singly or in combination of two or more of them. In this specification, a (meth)acrylate means a methacrylate and an acrylate.

In the present invention, the structure unit other than the structure unit of Formula (1) can be included. The compound (monomer) forming such a structure unit is not particularly limited as long as the effect of the invention is not impaired. Examples of the compound include acrylic acid, methacrylic acid, methyl (meth)acrylate, ethyl (meth)acrylate, isopropyl (meth)acrylate, n-butyl (meth)acrylate, cyclohexyl (meth)acrylate, isobornyl (meth)acrylate, adamantyl (meth)acrylate, dicyclopentanyl (meth)acrylate, dicyclopentenyl (meth)acrylate, dicyclopentenyloxyethyl (meth)acrylate, benzyl (meth)acrylate, phenethyl (meth)acrylate, γ-butyrolactone (meth)acrylate, tetrahydrofurfuryl (meth)acrylate, ethylcarbitol (meth)acrylate, methoxytriethylene glycol (meth)acrylate, methoxypolyethylene glycol (meth)acrylate, methoxydipropylene glycol (meth)acrylate, phenoxyethyl (meth)acrylate, phenoxydiethylene glycol (meth)acrylate, phenoxypolyethylene glycol (meth)acrylate, 2-hydroxy-3-phenoxypropyl acrylate, 2-(2-biphenyloxy)ethyl (meth)acrylate, acrylonitrile, methacrylonitrile, styrene, α-methylstyrene, 4-methyl styrene, 4-tert-butylstyrene, 4-methoxystyrene, 4-cyanostyrene, 4-vinylbenzoic acid, 4-vinylbiphenyl, 2-vinylnaphthalene, 4-fluorostyrene, 4-chlorostyrene, 4-bromostyrene, indene, maleimide, N-methylmaleimide, N-ethylmaleimide, N-cyclohexylmaleimide, N-phenylmaleimide, N-benzylmaleimide, N-(4-hydroxyphenyl)maleimide, 2-hydroxyethyl vinyl ether, 3-hydroxypropyl vinyl ether, 4-hydroxybutyl vinyl ether, 5-hydroxypentyl vinyl ether, 6-hydroxyhexyl vinyl ether, 4-hydroxycyclohexyl vinyl ether, 1,4-cyclohexanedimethanol monovinyl ether, diethylene glycol monovinyl ether, and dipropylene glycol monovinyl ether.

In the copolymer having the structure unit of Formula (1), the content of the structure unit of Formula (1) represented in % by mass of the mass of the monomer forming the unit structure of Formula (1) to the total mass of monomers forming the unit structure of the copolymer is, for example, 17% by mass to 100% by mass and preferably 20% by mass to 100% by mass.

The weight average molecular weight of the polymer is usually 1,000 to 200,000 and preferably 3,000 to 100,000. The weight average molecular weight is a value obtained by gel permeation chromatography (GPC).

The homopolymer or the copolymers may be used singly or in combination of two or more of them.

The content of the polymer in the resin composition for forming a color filter underlayer film of the present invention is usually 30% by mass to 99% by mass and preferably 50% by mass to 95% by mass based on the content of the solid content in the resin composition.

In the present invention, a method for obtaining the polymer is not particularly limited. Generally, the polymer can be obtained by polymerizing the compound (monomer) forming the structure unit of Formula (1) and compounds (monomers) other than the above mentioned compound, if desired, in a solvent under presence of a polymerization initiator usually at a temperature of 50° C. to 120° C. Thus obtained polymer is usually in a solution state in which the polymer is dissolved in the solvent. The polymer can also be used for the resin composition of the present invention in this state without isolation.

The polymer can be processed into an oily product or a powder by pouring the polymer solution obtained as described above into a stirred poor solvent such as hexane, diethyl ether, toluene, methanol, and water to reprecipitate the polymer, decanting or filtering the generated precipitate, washing the resultant product, if necessary, and drying at room temperature or under heating under normal pressure or reduced pressure. By these operations, the polymerization initiator and unreacted compounds coexisting with the polymer can be removed. In the present invention, the oily product or the powder of the polymer can be used as it is or can be used in a solution state formed by, for example, redissolving the oily product or the powder into the solvent described below.

<Acid Compound>

Examples of the acid compound contained in the resin composition for forming a color filter underlayer film of the present invention include sulfonic acid compounds such as p-toluenesulfonic acid, p-toluenesulfonic acid monohydrate, trifluoromethanesulfonic acid, pyridinium p-toluenesulfonate, camphorsulfonic acid, 5-sulfosalicylic acid, 5-sulfosalicylic acid dihydrate, 4-chlorobenzenesulfonic acid, 4-chlorobenzenesulfonic acid monohydrate, 4-hydroxybenzenesulfonic acid, 4-hydroxybenzenesulfonic acid monohydrate, benzenedisulfonic acid, benzenesulfonic acid, benzenesulfonic acid monohydrate, 2-naphthalenesulfonic acid, and 2-naphthalenesulfonic acid monohydrate; carboxylic acid compounds such as salicylic acid, citric acid, benzoic acid, and hydroxybenzoic acid; sulfonic acid ester-based thermal acid generators such as 2,4,4,6-tetrabromocyclohexadienone, benzoin tosylate, 2-nitrobenzyl tosylate, 4-nitrobenzyl tosylate, isopropyl p-toluenesulfonate, tert-butyl p-toluenesulfonate, and cyclohexyl p-toluenesulfonate; and organic onium salt-based thermal acid generators such as TA-100, TA-120, and TA-160 (all of which are manufactured by SAN-APRO LTD.), K-PURE [registered trademark] TAG-2689, TAG-2690, CXC-1614, and CXC-1738 (all of which are manufactured by King Industries Inc.), and San-Aid [registered trademark] SI-110L and SI-180L (manufactured by SANSHIN CHEMICAL INDUSTRY CO., LTD.). These acid compounds can be used singly or in combination of two or more of them.

The content of the acid compound in the resin composition for forming a color filter underlayer film of the present invention is usually 0.1% by mass to 20% by mass and preferably 0.2% by mass to 15% by mass based on the content of the solid content in the resin composition.

A method for preparing the resin composition for forming a color filter underlayer film of the present invention is not particularly limited. Examples of the method for preparing the resin composition for forming color filter underlayer film include dissolving the homopolymer or the copolymer having the structure unit of Formula (1) into a solvent, and mixing the resultant solution with the acid compound in a predetermined ratio to prepare a homogenous solution. Further, examples of the method for preparing the resin composition include a method of further adding other additives in an appropriate step in the above method, if necessary.

The solvent is not particularly limited as long as the solvent dissolves the homopolymer or the copolymer contained in the resin composition for forming a color filter underlayer film of the present invention. Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, γ-butyrolactone, N-methylpyrrolidone, and N-ethylpyrrolidone. These solvents may be used singly or in combination of two or more of them.

Among the solvents, propylene glycol monomethyl ether, propylene glycol monomethyl ether acetate, propylene glycol monoethyl ether, propylene glycol monopropyl ether, 2-heptanone, ethyl lactate, butyl lactate, cyclopentanone, cyclohexanone, and γ-butyrolactone are preferable from the viewpoint of improvement in a leveling property of a coating film formed by applying the resin composition for forming a color filter underlayer film of the present invention onto the substrate.

The resin composition for forming a color filter underlayer film of the present invention allows the cured film to be formed by the homopolymer or the copolymer and the acid compound. In order to improve a curing property, a crosslinking agent may also be further contained. Examples of the crosslinking agent include a hydroxymethyl group-substituted phenol compound and a compound having an alkoxyalkylated amino group. These crosslinking agents may be used singly or in combination of two or more of them.

Examples of the hydroxymethyl group-substituted phenol compound include 2-hydroxymethyl-4,6-dimethylphenol, 1,3,5-trihydroxymethylbenzene, and 3,5-dihydroxymethyl-4-methoxytoluene [2,6-bis(hydroxymethyl)-p-cresol].

Examples of the compound having an alkoxyalkylated amino group include nitrogen-containing compounds, such as (poly)methylolated melamine, (poly)methylolated glycoluril, (poly)methylolated benzoguanamine, and (poly)methylolated urea, that have a plurality of active methylol groups in one molecule and in which an alkyl group such as methyl group and butyl group is substituted for at least one of the hydrogen atoms of the hydroxy groups in the methylol groups.

The compound having an alkoxyalkylated amino group may be a mixture of mixing a plurality of substituted compounds, in which a mixture containing an oligomer component formed by partial self-condensation also exists. Such a mixture can also be used. Specific examples of the compound include CYMEL series commercial products such as hexamethoxymethylmelamine (CYMEL [registered trademark] 303, manufactured by Nihon Cytec Industries Inc.), tetrabutoxymethylglycoluril (CYMEL [registered trademark] 1170, manufactured by Nihon Cytec Industries Inc.), and tetramethoxymethylbenzoguanamine (CYMEL [registered trademark] 1123, manufactured by Nihon Cytec Industries Inc.), POWDERLINK series commercial products such as tetramethoxymethylglycoluril (POWDERLINK [registered trademark] 1174, manufactured by Nihon Cytec Industries Inc.), and NIKALAC series commercial products such as a methylated melamine resin (NIKALAC [registered trademark] MW-30HM, MW-390, MW-100LM and MX-750LM, manufactured by Sanwa Chemical Co., Ltd.) and a methylated urea resin (NIKALAC [registered trademark] MX-270, MX-280, and MX-290, manufactured by Sanwa Chemical Co., Ltd.). These crosslinking agents may be used singly or in combination of two or more of them.

When the crosslinking agent is used, the content of the crosslinking agent in the resin composition for forming a color filter underlayer film of the present invention is, for example, 35% by mass or less, preferably 1% by mass to 30% by mass or 1% by mass to 20% by mass, and more preferably 1% by mass to 10% by mass based on the content of the solid content in the resin composition for forming a color filter underlayer film. An excessive content of the crosslinking agent leads to an increase in color resist residue observed on the color filter underlayer film.

The resin composition of the present invention may contain a surfactant for improving applicability. Examples of the surfactant include nonionic surfactant such as polyoxyethylene alkyl ethers such as polyoxyethylene lauryl ether, polyoxyethylene stearyl ether, polyoxyethylene cetyl ether, and polyoxyethylene oleyl ether; plyoxyethylene alkylaryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as Eftop [registered trademark] EF301, EF303, and EF352 (all of which are manufactured by Mitsubishi Materials Electronic Chemicals Co., Ltd.), Megafac [registered trademark] F-171, F-173, R-30, R-40, and R-40-LM (all of which are manufactured by DIC Corporation), Fluorad FC430 and FC431 (all of which are manufactured by Sumitomo 3M Ltd.), Asahi Guard [registered trademark] AG710, Surflon [registered trademark] S-382, SC101, SC102, SC103, SC104, SC105, and SC106 (manufactured by Asahi Glass Co., Ltd.), and FTERGENT series products such as FTX-206D, FTX-212D, FTX-218, FTX-220D, FTX-230D, FTX-240D, FTX-212P, FTX-220P, FTX-228P, FTX-240G, and DFX-18 (manufactured by NEOS COMPANY LIMITED); and Organosiloxane Polymer KP341 (manufactured by Shin-Etsu Chemical Co., Ltd.). These surfactants may be used singly or in combination of two or more of them.

When the surfactant is used, the content of the surfactant in the resin composition for forming a color filter underlayer film of the present invention is usually 0.001% by mass to 3% by mass, preferably 0.01% by mass to 2% by mass, and more preferably 0.1% by mass to 1% by mass based on the content of the solid content in the resin composition for forming a color filter underlayer film.

The resin composition for forming a color filter underlayer film of the present invention may contain additives such as a light stabilizer, an ultraviolet absorber, a sensitizer, a plasticizer, an antioxidant, an adhesion aid, and an antifoaming agent, if necessary, as long as the effect of the present invention is not impaired.

<Method for Preparing Color Filter Underlayer Film or Planarization Film>

A method for preparing a color filter underlayer film or a planarization film using the resin composition for forming a color filter underlayer film of the present invention will be described. The color filter underlayer film or the planarization film is prepared by applying the resin composition for forming a color filter underlayer film of the present invention onto a substrate (for example, a semiconductor substrate, a glass substrate, a quartz substrate, a silicon wafer, a substrate on which various metal films, a planarization film, or the like are formed on the surface thereof) using a suitable coating method such as a spinner and a coater, and thereafter baking and curing the applied resin composition using a heating means such as a hot plate or an oven. The baking conditions are appropriately selected from a baking temperature of 80° C. to 300° C. and a baking time of 0.3 minute to 60 minutes. The baking may be carried out in two or more steps. The film thickness of the film formed from the resin composition for forming a color filter underlayer film of the present invention is, for example, 0.001 μm to 100 μm and preferably 0.01 μm to 10 μm.

EXAMPLES

Hereinafter, the present invention will be described in more detail with reference to Examples and Comparative Examples. The present invention, however, is not limited to these Examples.

[Measurement of Weight Average Molecular Weight of Polymer Obtained in Synthesis Examples Described Below]

The molecular weight of the polymer was measured by a GPC apparatus and the weight average molecular weight Mw was calculated in terms of polyethylene glycol and polyethylene oxide.

GPC apparatus: GPC system manufactured by Showa Denko KK (Shodex [registered trademark] GPC-101)
Columns: Shodex [registered trademark] KD-800RH, KD-800RL, KD-803, and KD-805
Column temperature: 50° C.
Eluent: N,N-dimethylformamide (30 mmol/L of lithium bromide hydrate (LiBr.H$_2$O), 30 mmol/L of phosphoric acid.anhydrous crystal (o-phosphoric acid), and 10 ml/L of tetrahydrofuran (THF) as additives)
Flow rate: 1.0 mL/min
Standard samples for preparing calibration curve: TSK standard polyethylene oxide (weight average molecular weight (Mw) about 900,000, 150,000, 100,000, and 30,000, manufactured by Tosoh Corporation) and polyethylene glycol (Peak top molecular weight (Mp) about 12,000, 4,000, and 1,000, manufactured by Polymer Laboratory Ltd.). In order to avoid overlapping peaks, measurements were separately carried out using two samples of a sample made by mixing four standard samples having molecular weights of 900,000, 100,000, 12,000, and 1,000, and a sample made by mixing three standard samples having molecular weights of 150,000, 30,000, and 4,000.

Synthesis of Polymer

Synthesis Example 1

40.0 g of 2-hydroxyethyl acrylate and 3.1 g of 2,2'-azobisisobutyronitrile were dissolved in 80.1 g of ethyl lactate, and thereafter this solution was added dropwise over 4 hours into the flask in which 49.2 g of ethyl lactate was maintained at 70° C. After the completion of the dropwise addition, the reaction was further carried out for 18 hours to give a polymer solution (solid content concentration: 25% by mass). The weight average molecular weight Mw of the obtained polymer was 7,300.

Synthesis Example 2

8.0 g of 2-hydroxyethyl acrylate, 32.0 g of methyl acrylate, and 2.0 g of 2,2'-azobisisobutyronitrile were dissolved in 78.0 g of propylene glycol monomethyl ether, and thereafter this solution was added dropwise over 4 hours into a flask in which 48.0 g of propylene glycol monomethyl ether was maintained at 65° C. After the completion of the dropwise addition, the reaction was further carried out for 18 hours to give a polymer solution (solid content concentration: 25.0% by mass). The weight average molecular weight Mw of the obtained polymer was 7,000.

Synthesis Example 3

40.0 g of 2-hydroxyethyl methacrylate and 3.0 g of 2,2'-azobisisobutyronitrile were dissolved in 80.0 g of propylene glycol monomethyl ether, and thereafter this solution was added dropwise over 4 hours into a flask in which 49.0 g of propylene glycol monomethyl ether was maintained at 70° C. After the completion of the dropwise addition, the reaction was further carried out for 18 hours to give a polymer solution (solid content concentration: 25% by mass). The weight average molecular weight Mw of the obtained polymer was 24,200.

Synthesis Example 4

40.0 g of 4-hydroxybutyl acrylate and 3.2 g of 2,2'-azobisisobutyronitrile were dissolved in 80.2 g of propylene glycol monomethyl ether, and thereafter this solution was added dropwise over 4 hours into a flask in which 49.4 g of propylene glycol monomethyl ether was maintained at 70° C. After the completion of the dropwise addition, the reaction was further carried out for 18 hours to give a polymer solution (solid content concentration: 25% by mass). The weight average molecular weight Mw of the obtained polymer was 5,500.

Synthesis Example 5

30.2 g of 2-hydroxypropyl acrylate, 10.0 g of benzyl acrylate, and 3.4 g of 2,2'-azobisisobutyronitrile were dissolved in 80.9 g of propylene glycol monomethyl ether, and thereafter this solution was added dropwise over 4 hours into a flask in which 49.8 g of propylene glycol monomethyl ether was maintained at 70° C. After the completion of the dropwise addition, the reaction was further carried out for 18 hours to give a polymer solution (solid content concentration: 25.0% by mass). The weight average molecular weight Mw of the obtained polymer was 13,500.

Synthesis Example 6

8.0 g of styrene, 32.0 g of glycidyl methacrylate, and 2.4 g of 2,2'-azobisisobutyronitrile were dissolved in 78.7 g of propylene glycol monomethyl ether acetate, and thereafter this solution was added dropwise over 4 hours into a flask in which 48.5 g of propylene glycol monomethyl ether acetate was maintained at 70° C. After the completion of the dropwise addition, the reaction was further carried out for 18 hours to give a polymer solution (solid content concentration: 25.0% by mass). The weight average molecular weight Mw of the obtained polymer was 6,500.

Synthesis Example 7

40.0 g of methyl methacrylate, 4.7 g of 2-hydroxyethyl methacrylate, 2.4 g of methacrylic acid, and 3.1 g of 2,2'-azobisisobutyronitrile were dissolved in 61.2 g of propylene glycol monomethyl ether acetate, and thereafter this solution was added dropwise over 4 hours into a flask in which 55.7 g of propylene glycol monomethyl ether acetate was maintained at 70° C. After the completion of the dropwise addition, the reaction was further carried out for 18 hours to give a polymer solution (solid content concentration: 30.0% by mass). The weight average molecular weight Mw of the obtained polymer was 9,300.

Synthesis Example 8

25.0 g of styrene, 10.1 g of 2-hydroxyethyl acrylate, 27.4 g of 2-[(3,5-dimethylpyrazolyl)carbonylamino]ethyl methacrylate (Karenz [registered trademark] MOI-BP (manufactured by Showa Denko KK)), and 2.8 g of 2,2'-azobisisobutyronitrile were dissolved in 65.4 g of propylene glycol monomethyl ether, and thereafter this solution was added dropwise over 4 hours into a flask in which 32.7 g of propylene glycol monomethyl ether was maintained at 70° C. After the completion of the dropwise addition, the reaction was further carried out for 18 hours to give a polymer solution (solid content concentration: 40.0% by mass). The weight average molecular weight Mw of the obtained polymer was 22,500.

Synthesis Example 9

40.0 g of 2,3-dihydroxypropyl methacrylate (Blemmer [registered trademark] GLM (manufactured by NOF Corporation)) and 3.0 g of 2,2'-azobisisobutyronitrile were dissolved in 80.0 g of propylene glycol monomethyl ether, and thereafter this solution was added dropwise over 4 hours into a flask in which 49.0 g of propylene glycol monomethyl ether was maintained at 70° C. After the completion of the dropwise addition, the reaction was further carried out for 18 hours to give a polymer solution (solid content concentration: 25% by mass). The weight average molecular weight Mw of the obtained polymer was 19,400.

Preparation of Resin Composition for Forming Color Filter Underlayer Film

Example 1

8.0 g of the solution of the polymer obtained in Synthesis Example 1 and 0.1 g of p-toluenesulfonic acid monohydrate as an acid compound were dissolved in 72.0 g of propylene glycol monomethyl ether and 24.9 g of ethyl lactate to prepare a solution. Thereafter, the solution was filtered using a polyethylene microfilter having a pore diameter of 0.10 μm to prepare a resin composition for forming a color filter underlayer film.

Example 2

8.0 g of the solution of the polymer obtained in Synthesis Example 1, 0.02 g of p-toluenesulfonic acid monohydrate as an acid compound, and 0.2 g of tetramethoxymethylglycoluril (POWDERLINK [registered trademark] 1174 (manufactured by Nihon Cytec Industries Inc.) as a crosslinking agent were dissolved in 76.1 g of propylene glycol monomethyl ether and 26.6 g of ethyl lactate to prepare a solution. Thereafter, the solution was filtered using a polyethylene microfilter having a pore diameter of 0.10 μm to prepare a resin composition for forming a color filter underlayer film.

Example 3

8.0 g of the solution of the polymer obtained in Synthesis Example 1, 0.02 g of p-toluenesulfonic acid monohydrate as an acid compound, and 0.2 g of a methylated melamine resin (NIKALAC [registered trademark] MW-390 (manufactured by Sanwa Chemical Co., Ltd.)) as a crosslinking agent were dissolved in 76.1 g of propylene glycol monomethyl ether and 26.6 g of ethyl lactate to prepare a solution. Thereafter, the solution was filtered using a polyethylene microfilter having a pore diameter of 0.10 μm to prepare a resin composition for forming a color filter underlayer film.

Example 4

8.0 g of the solution of the polymer obtained in Synthesis Example 2, 0.02 g of pyridinium p-toluenesulfonate as an acid compound, and 0.2 g of tetramethoxymethylglycoluril (POWDERLINK [registered trademark] 1174 (manufactured by Nihon Cytec Industries Inc.)) as a crosslinking agent were dissolved in 70.1 g of propylene glycol monomethyl ether and 32.6 g of ethyl lactate to prepare a solution. Thereafter, the solution was filtered using a polyethylene microfilter having a pore diameter of 0.10 μm to prepare a resin composition for forming a color filter underlayer film.

Example 5

8.0 g of the solution of the polymer obtained in Synthesis Example 3 and 0.2 g of pyridinium p-toluenesulfonate as an acid compound were dissolved in 69.5 g of propylene glycol monomethyl ether and 32.3 g of ethyl lactate to prepare a solution. Thereafter, the solution was filtered using a polyethylene microfilter having a pore diameter of 0.10 μm to prepare a resin composition for forming a color filter underlayer film.

Example 6

8.0 g of the solution of the polymer obtained in Synthesis Example 3, 0.2 g of pyridinium p-toluenesulfonate as an acid compound, and 0.01 g of DFX-18 (manufactured by NEOS COMPANY LIMITED) as a surfactant were dissolved in 69.8 g of propylene glycol monomethyl ether and 32.5 g of ethyl lactate to prepare a solution. Thereafter, the solution was filtered using a polyethylene microfilter having a pore diameter of 0.10 μm to prepare a resin composition for forming a color filter underlayer film.

Example 7

8.0 g of the solution of the polymer obtained in Synthesis Example 3, 0.02 g of pyridinium p-toluenesulfonate as an acid compound, 0.2 g of tetramethoxymethylglycoluril (POWDERLINK [registered trademark] 1174, (manufactured by Nihon Cytec Industries Inc.)) as a crosslinking agent, and 0.01 g of DFX-18 (manufactured by NEOS COMPANY LIMITED) as a surfactant were dissolved in 70.5 g of propylene glycol monomethyl ether and 32.8 g of ethyl lactate to prepare a solution. Thereafter, the solution was filtered using a polyethylene microfilter having a pore diameter of 0.10 μm to prepare a resin composition for forming a color filter underlayer film.

Example 8

8.0 g of the solution of the polymer obtained in Synthesis Example 4 and 0.2 g of pyridinium p-toluenesulfonate as an acid compound were dissolved in 69.5 g of propylene glycol monomethyl ether and 32.3 g of ethyl lactate to prepare a solution. Thereafter, the solution was filtered using a polyethylene microfilter having a pore diameter of 0.10 μm to prepare a resin composition for forming a color filter underlayer film.

Example 9

8.0 g of the solution of the polymer obtained in Synthesis Example 4, 0.02 g of pyridinium p-toluenesulfonate as an acid compound, and 0.2 g of tetramethoxymethylglycoluril (POWDERLINK [registered trademark] 1174 (manufactured by Nihon Cytec Industries Inc.)) as a crosslinking agent were dissolved in 70.1 g of propylene glycol monomethyl ether and 32.6 g of ethyl lactate to prepare a solution. Thereafter, the solution was filtered using a polyethylene microfilter having a pore diameter of 0.10 μm to prepare a resin composition for forming a color filter underlayer film.

Example 10

8.0 g of the solution of the polymer obtained in Synthesis Example 5 and 0.2 g of pyridinium p-toluenesulfonate as an acid compound were dissolved in 69.5 g of propylene glycol monomethyl ether and 32.3 g of ethyl lactate to prepare a solution. Thereafter, the solution was filtered using a polyethylene microfilter having a pore diameter of 0.10 μm to prepare a resin composition for forming a color filter underlayer film.

Example 11

8.0 g of the solution of the polymer obtained in Synthesis Example 5, 0.02 g of pyridinium p-toluenesulfonate as an acid compound, and 0.2 g of tetramethoxymethylglycoluril (POWDERLINK [registered trademark] 1174 (manufactured by Nihon Cytec Industries Inc.)) as a crosslinking agent were dissolved in 70.1 g of propylene glycol monomethyl ether and 32.6 g of ethyl lactate to prepare a solution. Thereafter, the solution was filtered using a polyethylene microfilter having a pore diameter of 0.10 μm to prepare a resin composition for forming a color filter underlayer film.

Example 12

8.0 g of the solution of the polymer obtained in Synthesis Example 1, 0.02 g of p-toluenesulfonic acid monohydrate as an acid compound, and 0.6 g of tetramethoxymethylglycoluril (POWDERLINK [registered trademark] 1174 (manufactured by Nihon Cytec Industries Inc.)) as a crosslinking agent were dissolved in 89.9 g of propylene glycol monomethyl ether and 32.5 g of ethyl lactate to prepare a solution. Thereafter, the solution was filtered using a polyethylene microfilter having a pore diameter of 0.10 μm to prepare a resin composition for forming a color filter underlayer film.

Example 13

8.0 g of the solution of the polymer obtained in Synthesis Example 1, 0.02 g of p-toluenesulfonic acid monohydrate as an acid compound, and 0.8 g of tetramethoxymethylglycoluril (POWDERLINK [registered trademark] 1174 (manufactured by Nihon Cytec Industries Inc.)) as a crosslinking agent were dissolved in 96.7 g of propylene glycol monomethyl ether and 35.5 g of ethyl lactate to prepare a solution. Thereafter, the solution was filtered using a polyethylene microfilter having a pore diameter of 0.10 μm to prepare a resin composition for forming a color filter underlayer film.

Example 14

8.0 g of the solution of the polymer obtained in Synthesis Example 1, 0.02 g of p-toluenesulfonic acid monohydrate as an acid compound and, 1.0 g of tetramethoxymethylglycoluril (POWDERLINK [registered trademark] 1174 (Nihon Cytec Industries Inc.)) as a crosslinking agent were dissolved in 103.6 g of propylene glycol monomethyl ether and 38.4 g of ethyl lactate to prepare a solution. Thereafter, the solution was filtered using a polyethylene microfilter having a pore diameter of 0.10 µm to prepare a resin composition for forming a color filter underlayer film.

Example 15

8.0 g of the solution of the polymer obtained in Synthesis Example 9 and 0.2 g of p-toluenesulfonic acid monohydrate as an acid compound were dissolved in 69.5 g of propylene glycol monomethyl ether and 32.3 g of ethyl lactate to prepare a solution. Thereafter, the solution was filtered using a polyethylene microfilter having a pore diameter of 0.10 µm to prepare a resin composition for forming a color filter underlayer film.

Example 16

8.0 g of the solution of the polymer obtained in Synthesis Example 9 and 0.1 g of K-PURE [registered trademark] TAG-2689 (manufactured by King Industries Inc.) as an acid compound were dissolved in 66.0 g of propylene glycol monomethyl ether and 30.9 g of ethyl lactate to prepare a solution. Thereafter, the solution was filtered using a polyethylene microfilter having a pore diameter of 0.10 µm to prepare a resin composition for forming a color filter underlayer film.

Comparative Example 1

7.0 g of the solution of the polymer obtained in Synthesis Example 6, 0.4 g of an epoxy resin jER [registered trademark] 828 (manufactured by Mitsubishi Chemical Corporation), and 0.08 g of San-Aid [registered trademark] SI-100 L (γ-butyrolactone solution, solid content concentration: 49% by mass) (manufactured by Sanshin Chemical Industry Co., Ltd.) as an acid compound were dissolved in 89.1 g of propylene glycol monomethyl ether acetate to prepare a solution. Thereafter, the solution was filtered using a polyethylene microfilter having a pore diameter of 0.10 µm to prepare a resin composition for forming a color filter underlayer film.

Comparative Example 2

7.0 g of the solution of the polymer obtained in Synthesis Example 7 and 0.6 g of a methylated melamine resin (NIKALAC [registered trademark] MX-706 (2-propanol solution, solid content concentration 70% by mass) (manufactured by Sanwa Chemical Co., Ltd.) as a crosslinking agent were dissolved in 33.4 g of propylene glycol monomethyl ether and 73.5 g of propylene glycol monomethyl ether acetate to prepare a solution. Thereafter, the solution was filtered using a polyethylene microfilter having a pore diameter of 0.10 µm to prepare a resin composition for forming a color filter underlayer film.

Comparative Example 3

5.0 g of the solution of the polymer obtained in Synthesis Example 8 was dissolved in 65.6 g of propylene glycol monomethyl ether and 29.4 g of propylene glycol monomethyl ether acetate to prepare a solution. Thereafter, the solution was filtered using a polyethylene microfilter having a pore diameter of 0.10 µm to prepare a resin composition for forming a color filter underlayer film.

Comparative Example 4

8.0 g of the solution of the polymer obtained in Synthesis Example 1, 0.02 g of p-toluenesulfonic acid monohydrate as an acid compound, and 1.2 g of tetramethoxymethylglycoluril (POWDERLINK [registered trademark] 1174 (manufactured by Nihon Cytec Industries Inc.)) as a crosslinking agent were dissolved in 111.8 g of propylene glycol monomethyl ether and 41.9 g of ethyl lactate to prepare a solution. Thereafter, the solution was filtered using a polyethylene microfilter having a pore diameter of 0.10 µm to prepare a resin composition for forming a color filter underlayer film.

Comparative Example 5

8.0 g of the solution of the polymer obtained in Synthesis Example 1, 0.02 g of p-toluenesulfonic acid monohydrate as an acid compound, and 1.4 g of tetramethoxymethylglycoluril (POWDERLINK [registered trademark] 1174 (manufactured by Nihon Cytec Industries Inc.)) as a crosslinking agent were dissolved in 118.7 g of propylene glycol monomethyl ether and 44.9 g of ethyl lactate to prepare a solution. Thereafter, the solution was filtered using a polyethylene microfilter having a pore diameter of 0.10 µm to prepare a resin composition for forming a color filter underlayer film.

[Solvent Resistance Test]

Each of the resin compositions for forming a color filter underlayer film prepared in Examples 1 to 16 and Comparative Examples 1 to 5 was applied onto a silicon wafer using a spin coater. Each of the applied resin composition was baked on a hot plate at 100° C. for 1 minute and further 200° C. for 5 minutes to form a film having a film thickness of 0.06 µm. These films were immersed into each of propylene glycol monomethyl ether, propylene glycol monomethyl ether acetate, ethyl lactate, cyclohexanone, 2-propanol, and a tetramethylammonium hydroxide (hereinafter abbreviated as TMAH) aqueous solution having a concentration of 2.38% by mass under a temperature condition of 23° C. for 5 minutes and thereafter baked at 100° C. for 1 minute for drying. Film thickness was measured before immersion and after baking and the film thickness change was calculated. The solvent resistance was evaluated as follows: the case where film thickness was increased or decreased in 10% or more compared to the film thickness before the immersion even in one of the immersion solvents was determined to be "x", whereas the case where increase or decrease in film thickness is less than 10% in all of the solvents is determined to be "○". The evaluation results are listed in Table 1.

[Transmittance Measurement]

Each of the resin compositions for forming a color filter underlayer film prepared in Examples 1 to 16 and Comparative Examples 1 to 5 was applied onto a quartz substrate using a spin coater. Each of the applied resin composition was baked on a hot plate at 100° C. for 1 minute and further 200° C. for 5 minutes to form a film having a film thickness of 0.06 µm. The transmittances of these films were measured by changing wavelength at intervals of 2 nm in a wavelength range from 400 nm to 800 nm using an ultraviolet-visible spectrophotometer UV-2550 (manufactured by SHIMADZU CORPORATION). These films were heated at 260° C. for 5 minutes and thereafter the transmittances of these heated films were measured again by changing wavelength at intervals of 2 nm in the wavelength range from 400 nm to 800 nm. The lowest transmittances before and after heating at 260° C. for 5 minutes measured in the wavelength range from 400 nm to 800 nm are listed in Table 1.

[Color Resist Residue]

Each of the resin compositions for forming a color filter underlayer film prepared in Examples 1 to 16 and Comparative Examples 1 to 5 was applied onto a silicon wafer using a spin coater. Each of the applied resin compositions was baked on a hot plate at 100° C. for 1 minute and further 200° C. for 5 minutes to form a film having a film thickness of 0.06 μm. A photo radical polymerizable pigment dispersion-type blue color resist solution containing C. I. Pigment Blue 15: 6 and C. I. Pigment Violet 23 as pigments was applied onto this film and the applied blue color resist was baked on a hot plate at 100° C. for 1 minute to form a blue color resist film having a thickness of 0.5 Subsequently, the blue color resist film was exposed to light through a mask using an i-line stepper NSR-2205i12D (NA=0.63) (manufactured by Nikon Corp.), developed with a 2.38% by mass TMAH aqueous solution for 60 seconds, rinsed with ultrapure water for 20 seconds, and dried to form a rectangular pattern of 100 μm×100 μm. The blue color resist residue on the color filter underlayer film around the rectangular pattern was observed with a scanning electron microscope S-9260 (manufactured by Hitachi High-Technologies Corporation). The residue level evaluation results compared to the residue of Comparative Example 1 are listed in Table 1. Photographs taken around the rectangular pattern at a magnification of 30,000 times are illustrated in FIGS. 1 to 21. The residual levels were evaluated at three levels of blue color resist residue observed on the color filter underlayer film, that is, "Less" or "More" than, or "Equivalent" to the blue color resist residue of Comparative Example 1.

TABLE 1

| | Solvent resistance | Lowest transmittance/% (wavelength 400 nm-800 nm) | | Residue level (compared to Comparative Example 1) |
|---|---|---|---|---|
| | | 200° C. | 260° C. | |
| Example 1 | ○ | 99 | 99 | Less |
| Example 2 | ○ | 99 | 99 | Less |
| Example 3 | ○ | 99 | 99 | Less |
| Example 4 | ○ | 99 | 99 | Less |
| Example 5 | ○ | 99 | 99 | Less |
| Example 6 | ○ | 99 | 99 | Less |
| Example 7 | ○ | 99 | 99 | Less |
| Example 8 | ○ | 99 | 99 | Less |
| Example 9 | ○ | 99 | 99 | Less |
| Example 10 | ○ | 99 | 99 | Less |
| Example 11 | ○ | 99 | 99 | Less |
| Example 12 | ○ | 99 | 99 | Less |
| Example 13 | ○ | 99 | 99 | Less |
| Example 14 | ○ | 99 | 99 | Less |
| Example 15 | ○ | 99 | 99 | Less |
| Example 16 | ○ | 99 | 99 | Less |
| Comparative Example 1 | ○ | 99 | 99 | Reference |
| Comparative Example 2 | ○ | 99 | 99 | Equivalent |
| Comparative Example 3 | ○ | 99 | 99 | More |
| Comparative Example 4 | ○ | 99 | 99 | Equivalent |
| Comparative Example 5 | ○ | 99 | 99 | Equivalent |

From the results of Table 1, the film formed from the resin composition for forming a color filter underlayer film of the present invention had high solvent resistance, high transparency, and in addition, high heat resistance of not changing its color even after heating at 260° C. On the film formed from the resin composition for forming a color filter underlayer film of the present invention, almost no color resist residue was observed and thus the film formed from the resin composition for forming a color filter underlayer film of the present invention had excellent effect of reducing generation of the color resist residue. The films formed from the resin composition for forming a color filter underlayer film prepared in Comparative Examples 1 to 5 also had high solvent resistance, high in transparency, and in addition high heat resistance of not changing its color even after heating at 260° C. More color resist residues on the film formed from the resin composition for forming a color filter underlayer film prepared in Comparative Example 1 to Comparative Example 5, however, were observed than the color resist residue on the film formed from the resin composition for forming a color filter underlayer film of the present invention. In other words, the film formed from the resin composition for forming a color filter underlayer film prepared in Comparative Examples 1 to 5 had no or insufficient effect of reducing generation of the color resist residue.

INDUSTRIAL APPLICABILITY

The resin composition for forming a color filter underlayer film of the present invention is suitable as a material for forming color filter underlayer films, planarization films, filler-dispersed resist underlayer films, and the like in devices such as CCD image sensors, CMOS image sensors, liquid crystal displays, and organic EL displays. When a color resist pattern is formed on the color filter underlayer film of the present invention, generation of the color resist residue can be reduced and thus the resin composition for forming a color filter underlayer film of the present invention is useful to improve the quality and the yield of devices including a color filter.

Figure 1:
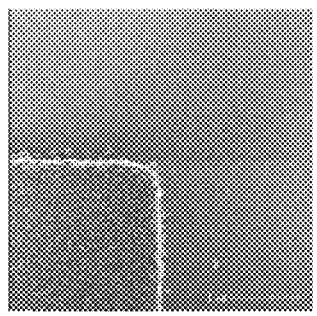
FIG. 1 is an electron microscope photograph of a blue color resist residue around a rectangular pattern on a color filter underlayer film formed from the resin composition for forming a color filter underlayer film of Example 1 taken at a magnification of 30,000.
Figure 2:
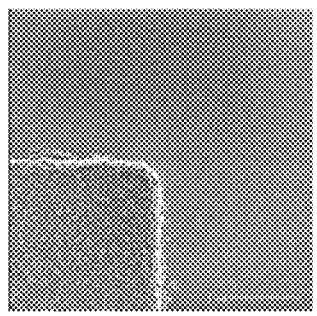
FIG. 2 is an electron microscope photograph of a blue color resist residue around a rectangular pattern on a color filter underlayer film formed from the resin composition for forming a color filter underlayer film of Example 2 taken at a magnification of 30,000.
Figure 3:
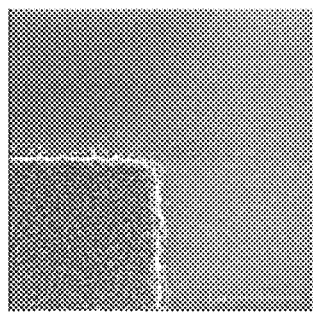
FIG. 3 is an electron microscope photograph of a blue color resist residue around a rectangular pattern on a color filter underlayer film formed from the resin composition for forming a color filter underlayer film of Example 3 taken at a magnification of 30,000.
Figure 4:
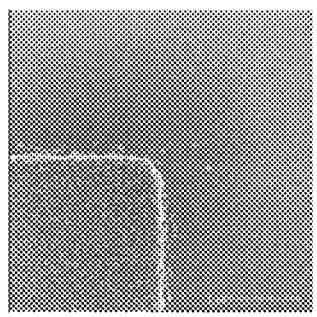
FIG. 4 is an electron microscope photograph of a blue color resist residue around a rectangular pattern on a color filter underlayer film formed from the resin composition for forming a color filter underlayer film of Example 4 taken at a magnification of 30,000.
Figure 5:
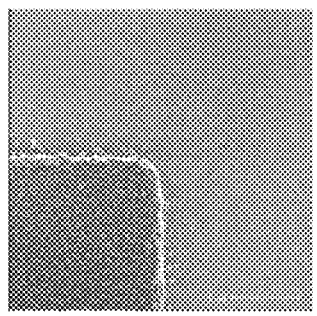
FIG. 5 is an electron microscope photograph of a blue color resist residue around a rectangular pattern on a color filter underlayer film formed from the resin composition for forming a color filter underlayer film of Example 5 taken at a magnification of 30,000.
Figure 6:
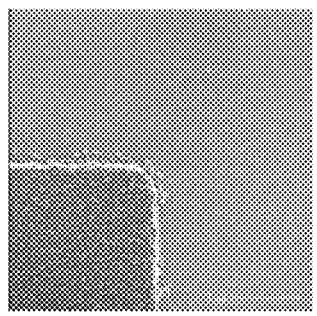
FIG. 6 is an electron microscope photograph of a blue color resist residue around a rectangular pattern on a color filter underlayer film formed from the resin composition for forming a color filter underlayer film of Example 6 taken at a magnification of 30,000.
Figure 7:
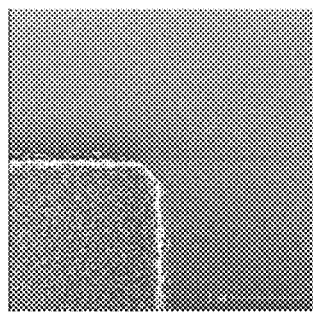
FIG. 7 is an electron microscope photograph of a blue color resist residue around a rectangular pattern on a color filter underlayer film formed from the resin composition for forming a color filter underlayer film of Example 7 taken at a magnification of 30,000.
Figure 8:
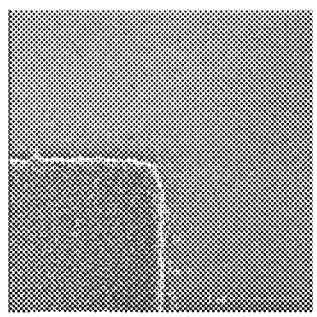
FIG. 8 is an electron microscope photograph of a blue color resist residue around a rectangular pattern on a color filter underlayer film formed from the resin composition for forming a color filter underlayer film of Example 8 taken at a magnification of 30,000.
Figure 9:
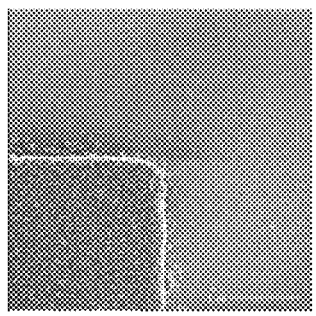
FIG. 9 is an electron microscope photograph of a blue color resist residue around a rectangular pattern on a color filter underlayer film formed from the resin composition for forming a color filter underlayer film of Example 9 taken at a magnification of 30,000.
Figure 10:
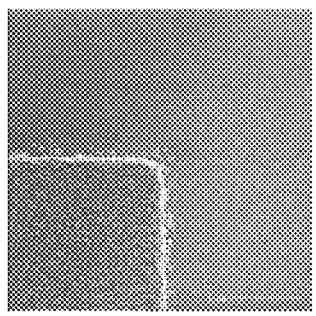
FIG. 10 is an electron microscope photograph of a blue color resist residue around a rectangular pattern on a color filter underlayer film formed from the resin composition for forming a color filter underlayer film of Example 10 taken at a magnification of 30,000.
Figure 11:
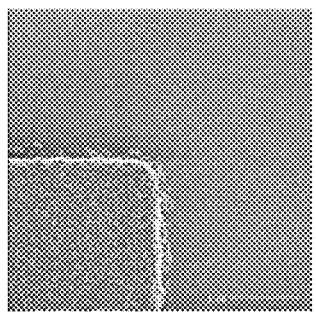
FIG. 11 is an electron microscope photograph of a blue color resist residue around a rectangular pattern on a color filter underlayer film formed from the resin composition for forming a color filter underlayer film of Example 11 taken at a magnification of 30,000.
Figure 12:
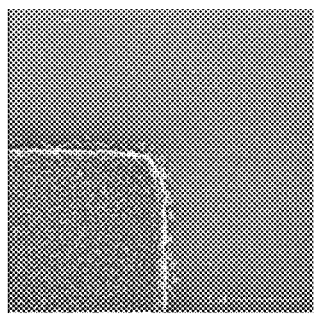
FIG. 12 is an electron microscope photograph of a blue color resist residue around a rectangular pattern on a color filter underlayer film formed from the resin composition for forming a color filter underlayer film of Example 12 taken at a magnification of 30,000.
Figure 13:
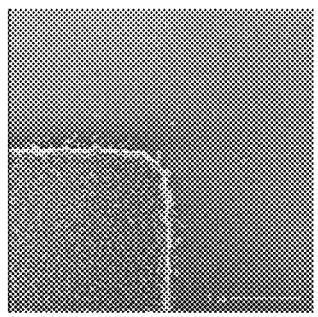
FIG. 13 is an electron microscope photograph of a blue color resist residue around a rectangular pattern on a color filter underlayer film formed from the resin composition for forming a color filter underlayer film of Example 13 taken at a magnification of 30,000.
Figure 14:
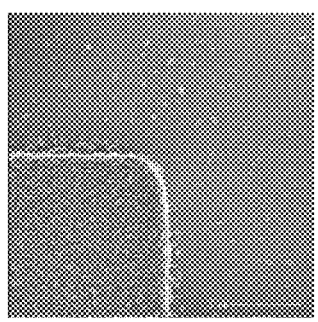
FIG. 14 is an electron microscope photograph of a blue color resist residue around a rectangular pattern on a color filter underlayer film formed from the resin composition for forming a color filter underlayer film of Example 14 taken at a magnification of 30,000.
Figure 15:
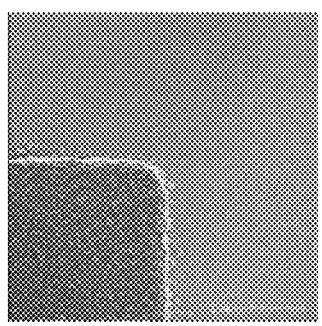
FIG. 15 is an electron microscope photograph of a blue color resist residue around a rectangular pattern on a color filter underlayer film formed from the resin composition for forming a color filter underlayer film of Example 15 taken at a magnification of 30,000.
Figure 16:
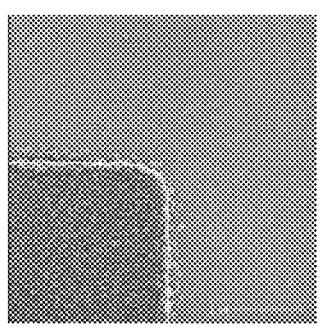
FIG. 16 is an electron microscope photograph of a blue color resist residue around a rectangular pattern on a color filter underlayer film formed from the resin composition for forming a color filter underlayer film of Example 16 taken at a magnification of 30,000.
Figure 17:
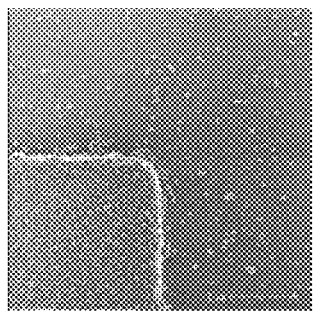
FIG. 17 is an electron microscope photograph of a blue color resist residue around a rectangular pattern on a color filter underlayer film formed from the resin composition for forming a color filter underlayer film of Comparative Example 1 taken at a magnification of 30,000.
Figure 18:
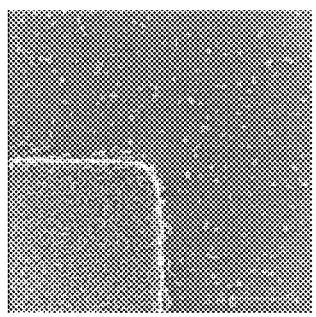
FIG. 18 is an electron microscope photograph of a blue color resist residue around a rectangular pattern on a color filter underlayer film formed from the resin composition for forming a color filter underlayer film of Comparative Example 2 taken at a magnification of 30,000.
Figure 19:
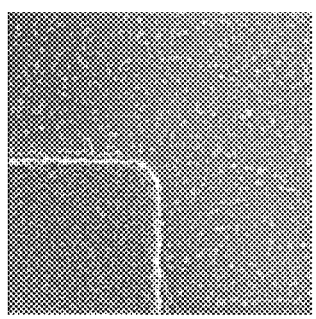
FIG. 19 is an electron microscope photograph of a blue color resist residue around a rectangular pattern on a color filter underlayer film formed from the resin composition for forming a color filter underlayer film of Comparative Example 3 taken at a magnification of 30,000.
Figure 20:
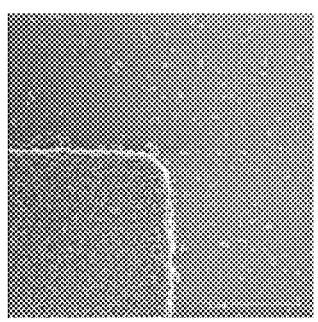
FIG. 20 is an electron microscope photograph of a blue color resist residue around a rectangular pattern on a color filter underlayer film formed from the resin composition for forming a color filter underlayer film of Comparative Example 4 taken at a magnification of 30,000.
Figure 21:
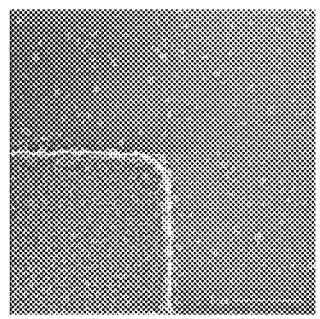
FIG. 21 is an electron microscope photograph of a blue color resist residue around a rectangular pattern on a color filter underlayer film formed from the resin composition for forming a color filter underlayer film of Comparative Example 5 taken at a magnification of 30,000.

The invention claimed is:

1. A method for forming a color filter comprising the steps of:
applying a resin composition for forming a color filter underlayer film on a substrate and heating the applied resin composition to form a color filter underlayer film;
applying a color resist on the color filter underlayer film and heating the applied color resist to form a color resist film; and
exposing the color resist film to light, developing the exposed color resist film, and rinsing the developed color resist film to form a color resist pattern; wherein the resin composition for forming a color filter underlayer film comprises:
a homopolymer having a structural unit of Formula (1):

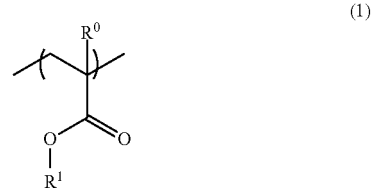

where
$R^0$ is a hydrogen atom or methyl group,
$R^1$ is a $C_{1-6}$ hydrocarbon group having at least one hydroxy group as a substituent, and
the $C_{1-6}$ hydrocarbon group further optionally has an ether bond;
an acid compound;
a solvent; and
a crosslinking agent in an amount of 0% by mass to 35% by mass based on a content of a solid content in the resin composition.

2. The method of claim 1, wherein the acid compound of the resin composition for forming a color filter underlayer film is a sulfonic acid compound, a carboxylic acid compound, a sulfonic acid ester-based thermal acid generator, or an organic onium salt-based thermal acid generator.

3. The method of claim 1, wherein the resin composition for forming a color filter underlayer film further comprises a surfactant.

* * * * *